（12）United States Patent
Duca et al.

(10) Patent No.: US 9,257,372 B2
(45) Date of Patent: Feb. 9, 2016

(54) SURFACE MOUNT PACKAGE FOR A SEMICONDUCTOR INTEGRATED DEVICE, RELATED ASSEMBLY AND MANUFACTURING PROCESS

(71) Applicants: STMicroelectronics (Malta) Ltd, Kirkop (MT); STMicroelectronics Pte Ltd, Singapore (SG)

(72) Inventors: Roseanne Duca, Ghaxaq (MT); Kim-Yong Goh, Singapore (SG); Xueren Zhang, Singapore (SG); Kevin Formosa, Zabbar Malta (MT)

(73) Assignees: STMicroelectronics (Mala) Ltd, Kirkop (MT); STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 14/032,075

(22) Filed: Sep. 19, 2013

(65) Prior Publication Data

US 2014/0091443 A1    Apr. 3, 2014

(30) Foreign Application Priority Data

Sep. 28, 2012   (IT) .............................. TO2012A0854

(51) Int. Cl.
*H01L 23/495*      (2006.01)
*H01L 21/56*       (2006.01)
(Continued)

(52) U.S. Cl.
CPC .......... *H01L 23/49541* (2013.01); *G01P 1/023* (2013.01); *H01L 21/56* (2013.01); *H01L 23/3107* (2013.01); *H05K 3/303* (2013.01); *H01L 21/565* (2013.01);
(Continued)

(58) Field of Classification Search
CPC ............. H01L 23/49541; H01L 21/56; H01L 23/3107; H01L 21/565; H01L 2224/48247; H01L 2924/1815; H01L 2924/1461; H01L 2924/00; H05K 3/303; H05K 3/3421; H05K 2201/09781
USPC ......... 257/666, 676, 675, 773, 774, 784, 786, 257/787, 788, 789, 790, 667; 438/127
See application file for complete search history.

(56) References Cited

U.S. PATENT DOCUMENTS 4,866,506 A * 9/1989 Nambu et al. .................. 257/667
5,028,741 A * 7/1991 Sanders et al. ................ 174/529
(Continued)

FOREIGN PATENT DOCUMENTS

DE    10 2008 040 565 A1    1/2010
DE    10 2010 038 988 A1    2/2011
(Continued)

*Primary Examiner* — Alexander Oscar Williams
(74) *Attorney, Agent, or Firm* — Seed IP Law Group PLLC

(57) ABSTRACT

A surface mount package of a semiconductor device, has: an encapsulation, housing at least one die including semiconductor material; and electrical contact leads, protruding from the encapsulation to be electrically coupled to contact pads of a circuit board; the encapsulation has a main face designed to face a top surface of the circuit board, which is provided with coupling features designed for mechanical coupling to the circuit board to increase a resonant frequency of the mounted package. The coupling features envisage at least a first coupling recess defined within the encapsulation starting from the main face, designed to be engaged by a corresponding coupling element fixed to the circuit board, thereby restricting movements of the mounted package.

16 Claims, 4 Drawing Sheets

(51) Int. Cl.
  *G01P 1/02* (2006.01)
  *H01L 23/31* (2006.01)
  *H05K 3/30* (2006.01)
  *H05K 3/34* (2006.01)

(52) U.S. Cl.
  CPC ........... *H01L 2224/45147* (2013.01); *H01L 2224/48247* (2013.01); *H01L 2924/1461* (2013.01); *H01L 2924/1815* (2013.01); *H05K 3/3421* (2013.01); *H05K 2201/09781* (2013.01)

(56) References Cited

U.S. PATENT DOCUMENTS

| | | | |
|---|---|---|---|
| 5,314,842 A * | 5/1994 | Sawaya et al. | 29/827 |
| 5,398,155 A * | 3/1995 | Sato et al. | 361/502 |
| 5,750,417 A * | 5/1998 | Nellissen | H01L 21/4846 250/492.22 |
| 5,837,562 A * | 11/1998 | Cho | G01P 1/023 257/E21.499 |
| 6,818,973 B1 | 11/2004 | Foster | |
| 7,208,772 B2 * | 4/2007 | Lee et al. | 257/99 |
| 7,646,089 B2 * | 1/2010 | Fukaya et al. | 257/687 |
| 7,943,408 B2 * | 5/2011 | Nakajima et al. | 438/40 |
| 8,344,397 B2 * | 1/2013 | Lerman | H01L 25/0753 257/100 |
| 2001/0050422 A1 | 12/2001 | Kishimoto et al. | |
| 2002/0053722 A1 * | 5/2002 | Sakamoto et al. | 257/678 |
| 2005/0070047 A1 * | 3/2005 | Kuratomi | H01L 21/566 438/107 |
| 2005/0098859 A1 | 5/2005 | Hasagawa | |
| 2005/0156323 A1 * | 7/2005 | Tokunaga | H01L 23/13 257/778 |
| 2007/0108436 A1 * | 5/2007 | Sanmyo | 257/13 |
| 2007/0132112 A1 | 6/2007 | Ozaki et al. | |
| 2007/0164402 A1 * | 7/2007 | Jung et al. | 257/666 |
| 2007/0272993 A1 * | 11/2007 | Haag et al. | 257/434 |
| 2008/0157305 A1 * | 7/2008 | Liao | 257/676 |
| 2009/0051052 A1 * | 2/2009 | Yoshioka | H01L 23/3107 257/788 |
| 2009/0091007 A1 * | 4/2009 | Tellkamp | H05K 3/3426 257/666 |
| 2009/0152714 A1 * | 6/2009 | Yamagishi | H01L 24/83 257/724 |
| 2010/0062098 A1 * | 3/2010 | Ando | B29C 33/38 425/385 |
| 2010/0084681 A1 * | 4/2010 | Nakajima et al. | 257/99 |
| 2010/0123227 A1 | 5/2010 | Dahilig et al. | |
| 2011/0221051 A1 * | 9/2011 | Sirinorakul | H01L 21/561 257/676 |
| 2012/0025258 A1 * | 2/2012 | Chan et al. | 257/99 |
| 2012/0206888 A1 | 8/2012 | Schillinger et al. | |
| 2012/0306065 A1 * | 12/2012 | Bin Mohd Arshad | H01L 24/97 257/676 |
| 2013/0056842 A1 * | 3/2013 | Sullivan | G02F 1/0102 257/432 |
| 2013/0194752 A1 * | 8/2013 | Marbella et al. | 361/719 |
| 2014/0027867 A1 * | 1/2014 | Goida | 257/416 |
| 2014/0028518 A1 * | 1/2014 | Arnold et al. | 343/841 |
| 2014/0061821 A1 * | 3/2014 | Kawano et al. | 257/401 |
| 2014/0217602 A1 * | 8/2014 | Yoshino | H01L 23/49582 257/773 |
| 2014/0225239 A1 * | 8/2014 | Kimura | H01L 24/89 257/666 |
| 2014/0327124 A1 * | 11/2014 | Ding | H01L 23/49562 257/676 |
| 2015/0017434 A1 * | 1/2015 | Dronen | B32B 38/10 428/352 |
| 2015/0041994 A1 * | 2/2015 | Gerber | H01L 23/4952 257/782 |
| 2015/0221625 A1 * | 8/2015 | Chun | H01L 25/18 257/707 |

FOREIGN PATENT DOCUMENTS

| | | |
|---|---|---|
| EP | 0 733 906 A1 | 9/1996 |
| JP | 8-130267 A * | 5/1996 |
| JP | 11-74439 A * | 3/1999 |
| JP | 2006-165114 A * | 6/2006 |

* cited by examiner

SURFACE MOUNT PACKAGE FOR A SEMICONDUCTOR INTEGRATED DEVICE, RELATED ASSEMBLY AND MANUFACTURING PROCESS

BACKGROUND

1. Technical Field

The present disclosure relates to a surface mount package for a semiconductor integrated device, a related assembly and manufacturing process; in particular, the following discussion will make reference, without this implying any loss of generality, to a package for an accelerometer sensor, e.g., for automotive applications.

2. Description of the Related Art

As it is known, semiconductor devices usually comprise a package, e.g., of plastic or ceramic material, designed to encapsulate one or more dice of semiconductor material integrating corresponding micromechanical structures (e.g., MEMS sensing structures) and/or integrated circuits (e.g., ASIC circuits coupled to the sensing structures); the package is commonly made by means of molding techniques.

For example, FIG. 1 shows a semiconductor device, denoted with 1, including a surface mount package 2, of a type usually known as "gull-wing leaded package".

Package 2 includes an encapsulation 3, made of a molding compound, e.g., of an epoxy resin material, encapsulating in a housing space contained therewithin one or more dice of the semiconductor device 1 (here not shown). A certain number of leads 4 (in FIG. 1 four leads per side are shown as an example), of a metallic material, are electrically connected to the die (or dice) within the encapsulation 3 and protrudes therefrom, so as to allow electrical connection to the outside environment, typically via soldering to a printed circuit board (PCB) of an external electronic apparatus.

Leads 4 are shaped as gull wings (thus the common name for the package type), and have, outside the encapsulation 3, a first substantially flat portion 4a, joined to the encapsulation 3, a second substantially flat portion 4b that is to be soldered to a contact pad on the external printed circuit board, and a sloped portion 4c, connecting and joining the first and second substantially flat portions 4a, 4b.

In particular, accelerometer integrated sensors are known, including a package (e.g., of the gull-wing leaded type), encapsulating a related micromechanical sensing structure and electronic circuit.

The package is designed to be coupled, e.g., via soldering, to a printed circuit board of an electronic apparatus, e.g., a portable apparatus (such as a smartphone, a tablet, a PDA, a portable PC, a camera), or an air-bag control module of an automotive vehicle.

In several applications, the mechanical resonant frequency of the packaged semiconductor device, when mounted on the external printed circuit board, is an important design specification, affecting the performance of the overall system.

For example, in the automotive field, accelerometer sensors used for airbag applications are often desired to have a minimum natural resonant frequency of at least 45 kHz, when mounted on the external board, in order to assure reliable operation.

BRIEF SUMMARY

The Applicant has realized that known packaging and assembling techniques may not assure the desired values for the minimum resonant frequency.

In particular, in case of the above discussed surface mount package, the Applicant has realized that undesired movements of the gull-wing shaped leads, e.g., a "swinging" thereof, may be a factor limiting the value of the natural resonant frequency of the packaged assembly.

One or more embodiments of the present disclosure is to provide an improved packaging and mounting solution for an integrated semiconductor device, which enables an increase in the mechanical resonant frequency performances.

According to one or more embodiments of the present disclosure, a package of an integrated semiconductor device, a related assembly and manufacturing process are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

An aspect of the present disclosure envisages improving the mechanical resonant frequency performances of a packaged semiconductor device mounted on an external board, by the provision of additional coupling elements between the package of the integrated semiconductor device and the external board, which are designed so as to restrict undesired movements, e.g., in all three directions, x, y and z of the three-dimensional space, thus increasing the natural resonant frequency of the resulting assembly.

Figure 1:
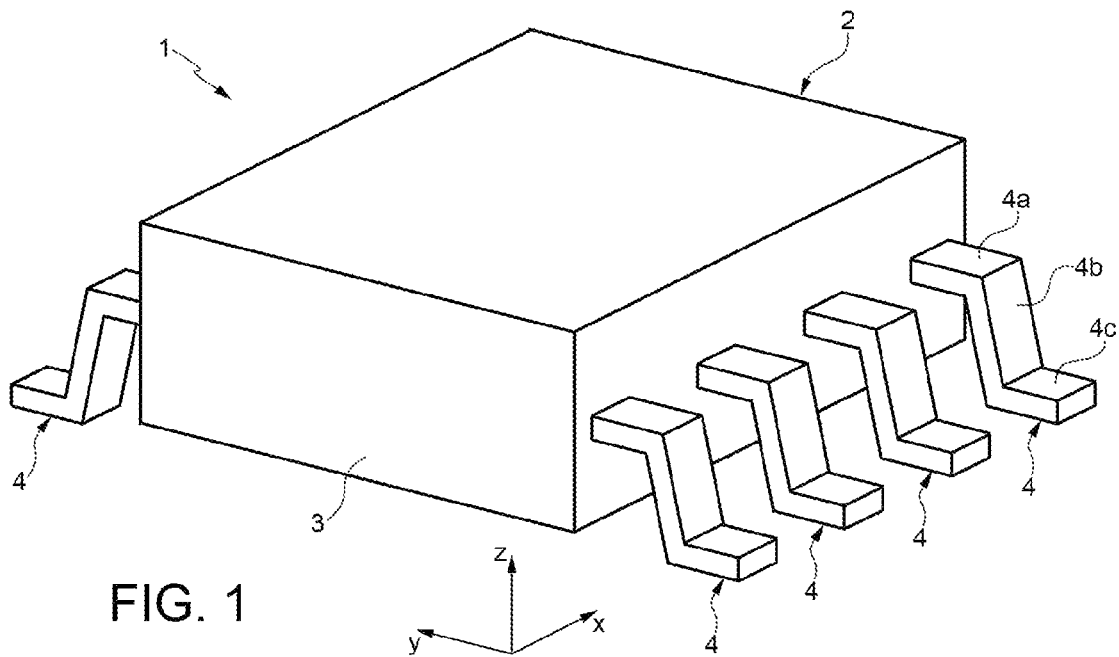
FIG. 1 is a schematic perspective view of a packaged semiconductor device of a known type.
Figure 2:
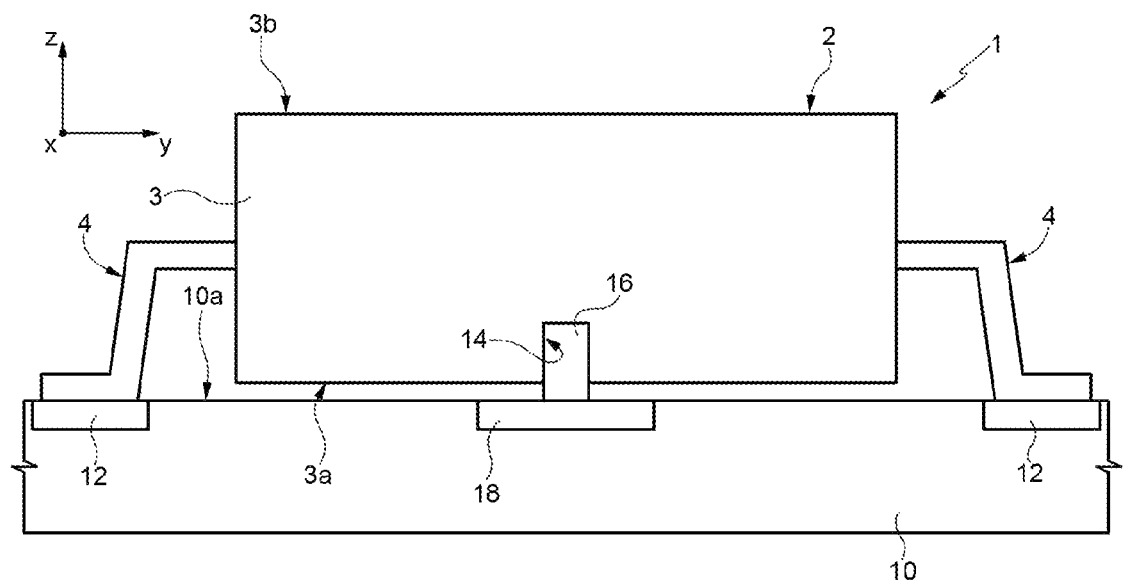
FIG. 2 is a cross-sectional view of a packaged semiconductor device, according to an embodiment of the present disclosure, mounted on a circuit board.

FIG. 2 shows schematically an integrated semiconductor device, denoted again with 1 (in general, same reference numerals are used to denote similar elements as those shown in FIG. 1), including a surface mount package 2, e.g., of the "gull-wing leaded" type.

The package 2 is soldered to an external electrical or electronic circuit board 10 (in particular a printed circuit board (PCB), where pads and conductive traces have been previously defined, in any known manner, e.g., via the screen-printing technique).

The leads 4 are mechanically and electrically coupled to respective contact pads 12, arranged at a front surface 10a of the circuit board 10, facing the package 2, by means of soldering.

The encapsulation 3 of the package 2 has a bottom surface 3a, facing the front surface 10a of the circuit board 10, and a top surface 3b, opposite to the bottom surface 3a along a vertical direction z, orthogonal to a horizontal plane xy of main extension of the package 2.

The bottom surface 3a of the encapsulation 3 is provided with coupling features, designed for further mechanical coupling with the circuit board 10.

In particular, at least one coupling recess (or hole) 14 is defined within the encapsulation 3, starting from the bottom surface 3a; the coupling recess 14 has a depth in the vertical direction z comprised e.g., between 50 μm and 150 μm, and a width (or diameter, in case of a circular section) in the horizontal plane xy comprised between 50 μm and 500 μm.

The coupling recess 14 is designed to be engaged with a respective coupling element 16, coupled and fixed to the circuit board 10, when the package 2 is mounted onto the same circuit board 10.

In one embodiment, the coupling element 16 is arranged at the front surface 10a of the circuit board 10, and at a suitable distance from the contact pads 12, so as to enter into the coupling recess 14, adhering to side and bottom walls thereof (in other words, the coupling element 16 assumes a shape matching that of the coupling recess 14, when the package 2 is soldered to the circuit board 10).

The engagement between the coupling element 16 and the coupling recess 14 hinders undesired movements of the packaged semiconductor device 1 along the vertical direction z and also along a first and a second horizontal directions x, y of the horizontal plane xy (forming with the vertical direction z a set of three Cartesian axes).

In a possible embodiment, the coupling element 16 is formed by a solder dam arranged at the top surface 10a of the circuit board 10, on a respective coupling pad 18, e.g., of copper material.

As it is known, a solder dam is a region of a suitable material (e.g., Polyimide or solder paste), which is placed between adjacent contact pads 12 (or traces) at the front surface 10a of the circuit board 10, in order to prevent the solder from flowing from one pad (or trace) to another, during the soldering and reflow operations.

Figure 3A:
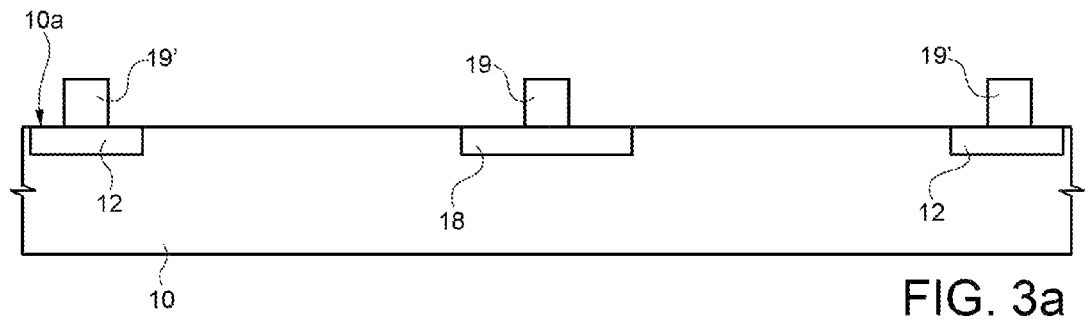
FIGS. 3a-3c are cross-sectional views relating to the assembling of the packaged semiconductor device to the circuit board.

As shown in FIG. 3a (which is not drawn to scale), a solder dam region 19 is first formed on the front surface 10a of the circuit board 10a, e.g., by screen printing in case it includes solder paste material, with an appropriate amount being placed at the zones designed to be underneath each one of the coupling recesses 14. At this stage, also solder contact regions 19' are formed, at each contact pad 12 arranged at the front surface 10a of the circuit board 10.

Figure 3B:
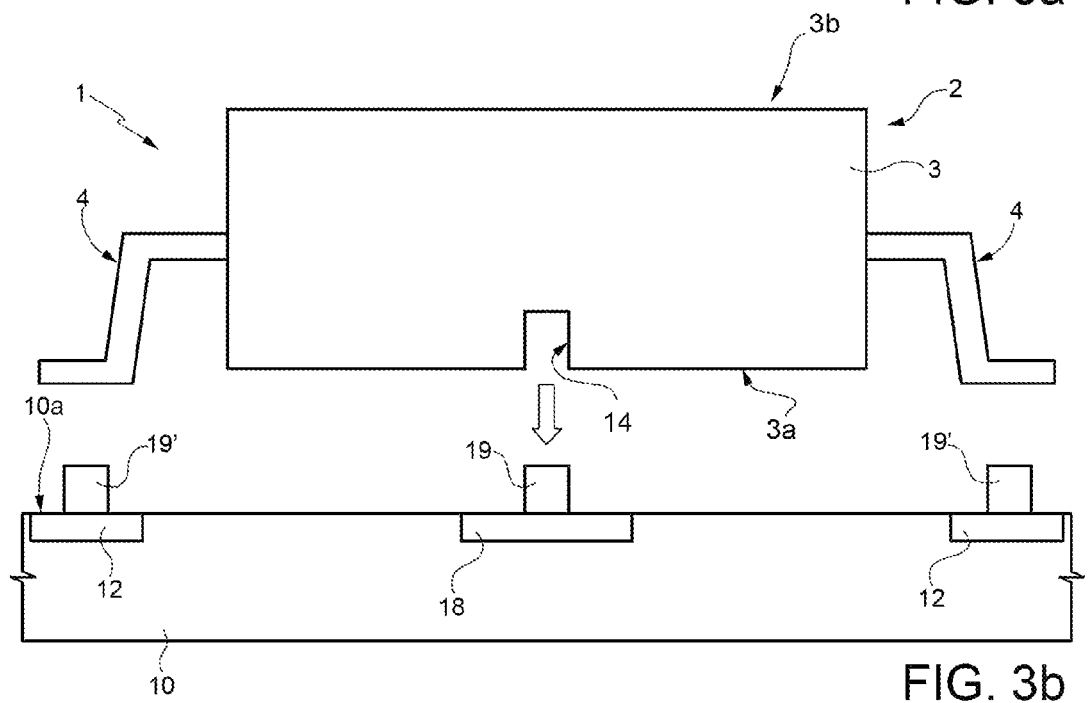

The package 2 is then mounted on the circuit board 10, e.g., via the "pick and place" technique, as schematically shown in FIG. 3b.

Figure 3C:
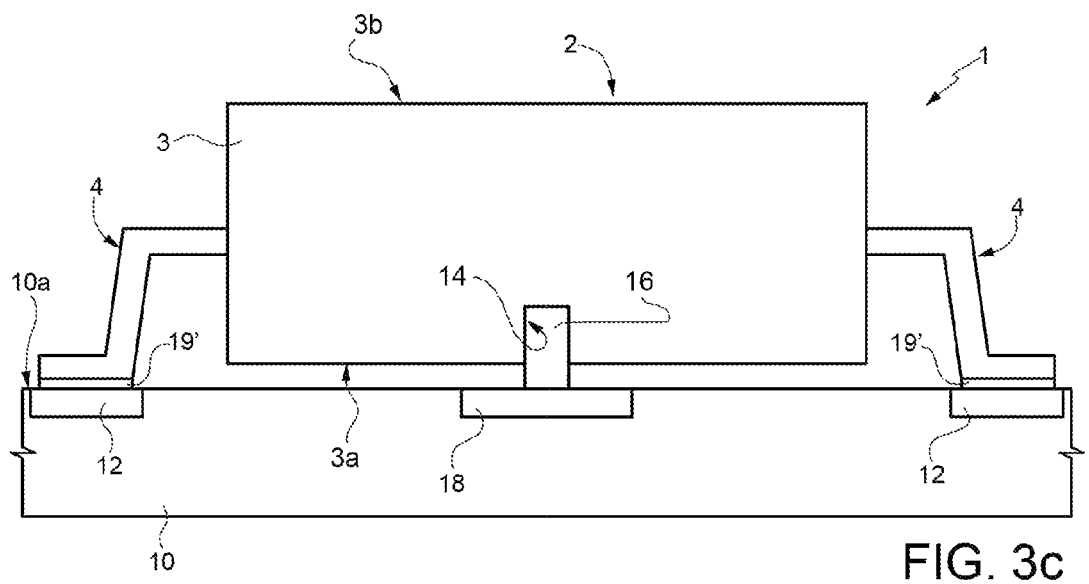

The solder dam region 19 thus fills the coupling recess 14, and the solder contact regions 19' contact the respective leads 4 of the package 2, as shown in FIG. 3c. After the usual solder reflow operation, the solder dam material adheres to the side and bottom walls of the coupling recess 14, and defines the coupling element 16, which suitably engages the same coupling recess 14.

A possible solution for the formation of each coupling recess 14 is now discussed, with reference to FIGS. 4a-4d; this solution envisages the exploitation of the ejector pins commonly present in the bottom part of the mold (in case, with suitable modifications of their shape), for the formation of the coupling recess 14 during molding of the encapsulation 3.

Figure 4A:
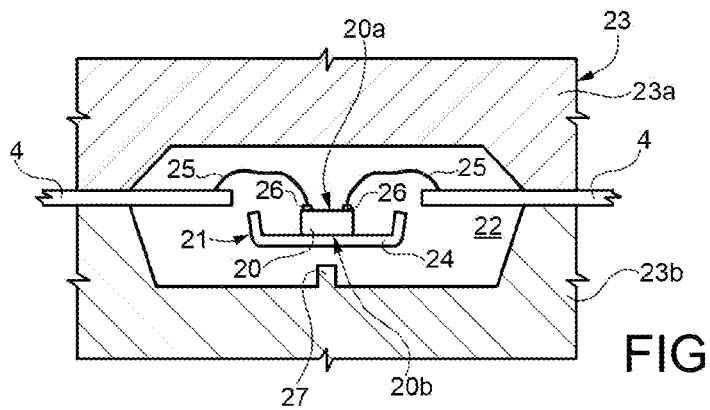
FIGS. 4a-4d are cross-sectional views of the packaged semiconductor device in successive steps of a corresponding molding process.
Figure 4B:
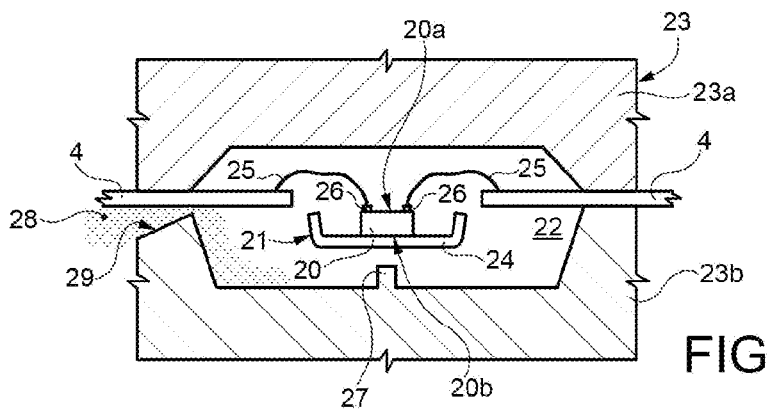
Figure 4C:
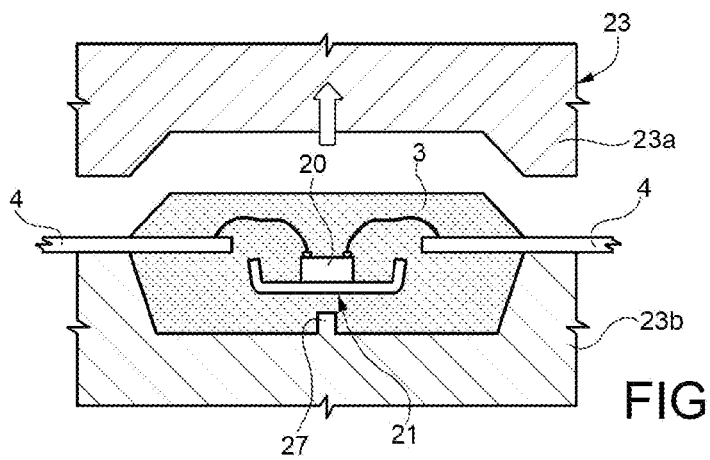

In detail, FIG. 4a shows an initial step of the process for molding the semiconductor device 1, which is shown, for sake of simplicity, as comprising a single die 20, e.g., integrating a sensing micromechanical structure.

In particular, a leadframe 21 of the semiconductor device 1 is positioned within a molding cavity 22 of a mold 23 of a molding apparatus (of a known type that is not herein described in detail). The leadframe 21 comprises a die pad 24, supporting the die 20 and arranged totally within the molding cavity 22, and is coupled to the leads 4 (just two of which are illustrated in FIG. 4a), which come out of the molding cavity 22. Conveniently, the die pad 24 and the leads 4 have one and the same thickness, for example of a few millimeters, and may be obtained by shaping and processing of one and the same ribbon of metal material, for example copper. Wires 25 electrically connect the leads 4 to electrical contacts 26 carried by a top surface 20a of the die 20 (opposite to a bottom surface 20b contacting the leadframe 21).

The mold 23 comprises a top half 23a, and a bottom half 23b, suitably shaped according to the desired shape to be conferred to the encapsulation 3, and together defining the molding cavity 22 (in particular, top, lateral and bottom walls thereof).

In particular, the bottom half 23b of the mold 23 is provided with at least one "ejector pin" 27, protruding from a base thereof facing the molding cavity 22 into the same molding cavity 22.

In a subsequent step of the molding process (FIG. 4b), an encapsulating material 28, in this case an epoxy resin (or other electrically non-conductive thermosetting plastic material), is injected under pressure within the molding cavity 22, through an input channel 29, set for example at a point where the leads 4 come out of the molding cavity 22. In this step, the molding cavity 22 is progressively filled with the encapsulating material, which has not, however, reached the desired compactness yet (the thermosetting process is still in progress). Clearly, the encapsulating material cannot fill the space occupied by the "ejector pin" 27 within the molding cavity 22.

Next (FIG. 4c), after the thermosetting process, when the encapsulating material has solidified, the top half 23a of the mold 23 is pulled away from the formed encapsulation 3.

Figure 4D:
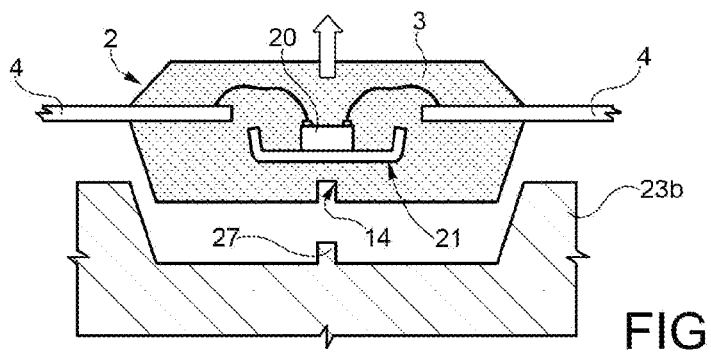

Afterwards, FIG. 4d, the encapsulation 3 is also detached from the bottom half 23b of the mold 23, by the action of the ejector pin 27, which exerts a pushing action along the vertical direction z (in a known manner, here not discussed in detail, e.g., sliding along a guide in the same vertical direction z).

After detachment from the mold 23, the package 2 is thus formed, having the coupling features (i.e., at least one coupling recess 14) defined at the bottom surface 3a of the encapsulation 3.

Figure 5A:
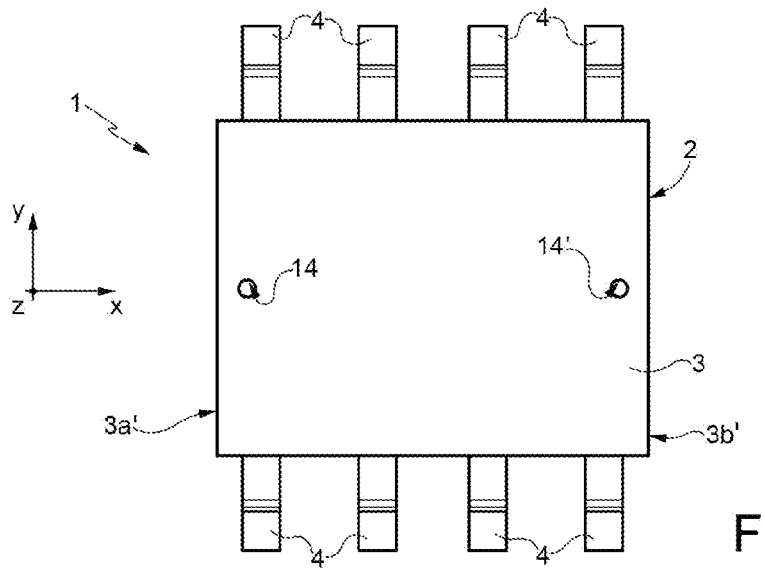
FIGS. 5a and 5b are bottom views of embodiments of the packaged semiconductor device according to embodiments of the present disclosure.

FIG. 5a shows a possible embodiment, which envisages the presence of two coupling recesses (in this case having a generic circular shape in the horizontal plane xy) at the bottom surface 3a of the encapsulation 3 of the package 2; here, a first coupling recess is denoted with 14, while a second and further coupling recess is denoted with 14'. The second recess 14' being configured to receive a second coupling element 16 of the first surface 10a of the circuit board 10.

The encapsulation 3 has a generically rectangular shape in plan view (in the horizontal plane xy, (FIG. 1)), and a first and a second lateral sides, 3a', 3b', from which no lead 4 protrudes (for example, these sides are parallel to the second horizontal axis y); the first and second lateral sides 3a', 3b' are in this case the minor sides in the perimeter of the encapsulation 3 in the horizontal plane xy (FIG. 1).

The first and second coupling recesses 14, 14', are arranged laterally with respect to the bulk of the encapsulation 3, at a respective minor lateral sides 3a', 3b', at about the middle of its extension along the second horizontal axis y; the first and second coupling recesses 14, 14' are aligned along the first horizontal axis x.

Figure 5B:
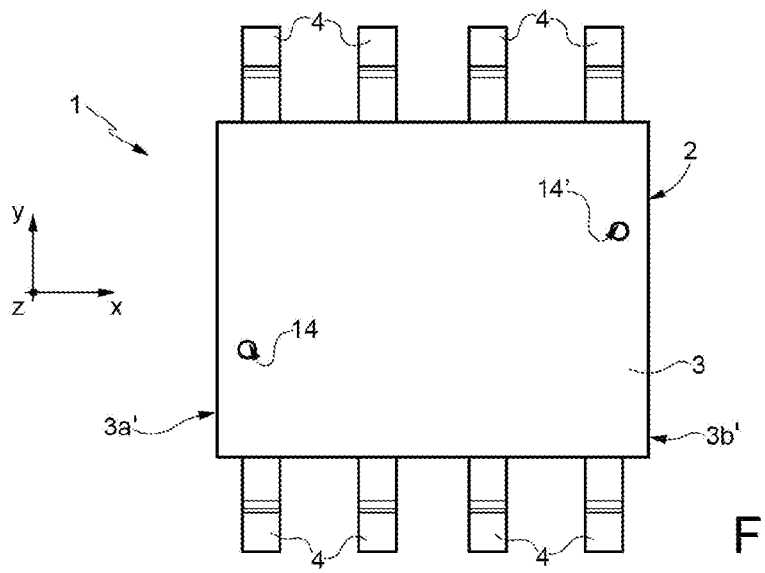

In a second embodiment, shown in FIG. 5b, the first and second coupling recesses 14, 14' are arranged at one third of the extension of the respective first or second lateral side 3a', 3b' along the second horizontal axis y, and are not aligned along the first horizontal axis x, but instead symmetrical with respect to a center of the structure.

The Applicant has shown a sensible increase in the natural resonant frequency of the packaged semiconductor device 1 mounted on the circuit board 10, when one or more coupling recesses 14, 14' are present at the bottom of the encapsulation 3.

In particular, the Applicant has shown a natural resonant frequency (relating to the first resonant mode) of about 80 kHz in the exemplary embodiment of FIG. 5a, and a natural resonant frequency (relating again to the first resonant mode) of about 77 kHz in the exemplary embodiment of FIG. 5b, compared to a natural resonant frequency of 34 kHz (thus lower than the desired value of 45 kHz for automotive applications) for the standard case where no coupling features are present.

In more details, the following Table 1 reports the exact values of the modal frequencies for the semiconductor devices 1 of FIG. 5a (Case A), FIG. 5b (Case B), compared to a device with a standard package (Case C), i.e., without coupling features.

TABLE 1

|  | CASE A | CASE B | CASE C |
| --- | --- | --- | --- |
| Mode 1 | 80296 Hz | 76737 Hz | 34388 Hz |
| Mode 2 | 81550 Hz | 78697 Hz | 38665 Hz |
| Mode 3 | 84265 Hz | 84626 Hz | 43877 Hz |
| Mode 4 | 102460 Hz | 94967 Hz | 46254 Hz |

The solution described has a number of advantages.

In particular, it allows to improve coupling between the surface mount package 2 and the circuit board 10, restricting undesired movements and thus increasing the mechanical resonant frequency, as clearly shown in the above Table 1.

This effect is more pronounced, if adhesion between the mold compound material of the encapsulation 3 of the package 2 and the material (e.g., the solder dam) filling the coupling recess (or recesses) 14 is good; however, the engagement between the coupling element(s) 16 and the corresponding coupling recess(es) 14 allows in any case to increase the modal frequencies of the overall assembly.

The above features render the use of the discussed packaging solution particularly suited for automotive applications.

Figure 6:
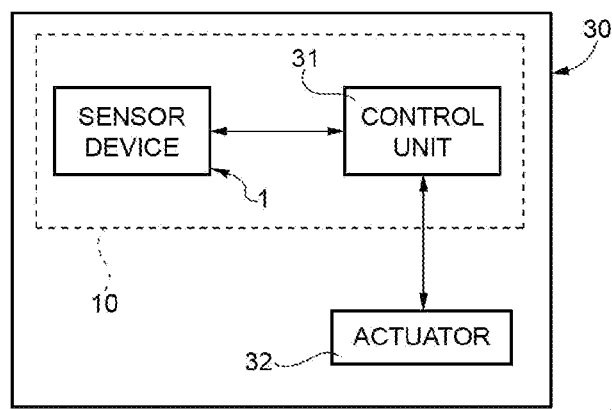
FIG. 6 is a simplified block diagram of an electronic system including the packaged semiconductor device of FIG. 2.

In this regard, FIG. 6 shows schematically a control module 30 of an air bag of an automotive vehicle (here not shown), including: the semiconductor device 1, in this case defining an accelerometer sensor (thus including, in a known manner, here not shown in detail, a first die integrating an acceleration sensing structure and a second die integrating a related application specific integrated circuit (ASIC)); a control unit 31, coupled to the semiconductor device 1 and receiving the detected acceleration signals/values; and an actuator 32, controlled by the control unit 31 and configured to activate the air bag mechanism upon occurrence of determined acceleration conditions.

The semiconductor device 1 and the control unit 31 are electrically coupled to a same printed circuit board, corresponding to the above discussed circuit board 10.

Finally, it is clear that modifications and variations can be made to what is described and illustrated herein, without thereby departing from the scope of the present disclosure.

In particular, the number of coupling recesses 14 (each designed to define a respective coupling feature during assembly, hindering undesired movements), and their arrangement, may be suitably chosen, according to the specific applications, so as to ensure the requested modal frequencies; the general criterion will be in any case that of minimizing the number of coupling recesses, while still satisfying the desired frequency requirements.

Also the shape and depth of each coupling recess 14 could be different; for example, the side walls of the coupling recess 14 may be slightly tapered, in order to ease extraction of the package 2 from the mold 23.

Moreover, a different solution could be envisaged to anchor the package 2 to the circuit board 10, in order to define restrictions for its resonance movement when assembled to the same circuit board 10.

For example, dots (or small regions) of glue or other suitable adhesion material, could be placed on the front surface 10a of the circuit board 10, in order to provide the further desired mechanical coupling with the package 2, having the discussed coupling features.

Use of glue or other adhesion material may allow to avoid redesigning of the layout of the circuit board 10, since it does not require definition thereon of further coupling pads 18; in any case, use of a proper glue or adhesion material is required, having desired adhesion and viscosity properties.

Moreover, it is clear that different shapes may be envisaged for the package 2, as likewise there may be envisaged a different number of leads 4, protruding from the encapsulation 3 for electrical soldering to the circuit board 10.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A surface mount package comprising:
   an encapsulation housing a die of semiconductor material, the encapsulation including a first surface that includes a recess having side surfaces and a bottom formed by the encapsulation, at least a portion of the recess being void to receive a coupling element of a circuit board; and
   electrical contact leads protruding from the encapsulation and configured to be coupled to contact pads of the first surface of the circuit board.

2. The package according to claim 1, wherein when the package is mounted onto the first surface of the circuit board and the coupling element is received by the recess, an engagement between the recess and the coupling element restricts movement of the encapsulation.

3. The package according to claim 1, wherein the recess has a depth along a direction transverse to the first surface between 50 μm and 150 μm.

4. The package according to claim 1, wherein the recess is a first recess and the coupling element is a first coupling element, the package further comprising a second recess, the second recess being configured to receive a second coupling element of the first surface of the circuit board.

5. The package according to claim 4, wherein the encapsulation has a generically rectangular shape in plan view, with major sides from which the electrical contact leads protrude and minor sides;

wherein the first and second recesses are arranged at minor sides, respectively.

6. The package according to claim 5, wherein the first and second recesses are arranged at a middle of said minor sides, respectively.

7. The package according to claim 1, further comprising a die pad housed within said encapsulation and supporting the die.

8. The package according to claim 1, wherein the die is an accelerometer.

9. The package according to claim 1, wherein the package is a gull-wing leaded type package.

10. A process comprising:
   providing electrical contact leads configured to be electrically coupled to contact pads of a circuit board; and
   forming an encapsulation housing a die of semiconductor material and a portion of the electrical contact leads, the encapsulation having a recess that includes side surfaces and a bottom delimited by the encapsulation, the recess being at least partially void to receive a coupling element of a circuit board.

11. The process according to claim 10, wherein forming an encapsulation comprises allowing encapsulation material to flow around a protrusion in a surface of a mold that comprises the die and the portion of the electrical contact leads and forms the recess in the encapsulation.

12. The process according to claim 11, wherein forming an encapsulation comprises injecting encapsulation material into a mold moving an ejector pin that pushes some of the encapsulation material away from a surface of the mold and forms a recess that is the coupling element.

13. The process according to claim 10 further including coupling the electrical contact leads to contact pads of the circuit board, the coupling element extending into the recess of the encapsulation.

14. The process according to claim 13, further comprising coupling the encapsulation to the coupling feature of the circuit board, wherein the coupling comprises:
   depositing solder material on a first surface of the circuit board;
   positioning the encapsulation over the solder material on the first surface of the circuit board with the solder material in the recess;
   reflowing the solder material and adhering said solder material to the encapsulation in the recess.

15. The process according to claim 10 wherein the encapsulation comprises a plurality of recesses in the encapsulation.

16. The process according to claim 10 wherein the die is an accelerometer.

\* \* \* \* \*